United States Patent [19]

Smolley

[11] Patent Number: 4,847,731

[45] Date of Patent: Jul. 11, 1989

[54] LIQUID COOLED HIGH DENSITY PACKAGING FOR HIGH SPEED CIRCUITS

[75] Inventor: Robert Smolley, Portuguese Bend, Calif.

[73] Assignee: The United States of America as represented by the Secretary of the Navy, Washington, D.C.

[21] Appl. No.: 214,991

[22] Filed: Jul. 5, 1988

[51] Int. Cl.$^4$ .............................................. H05K 7/20
[52] U.S. Cl. ........................................ 361/385; 357/82; 361/401; 165/104.26; 165/907
[58] Field of Search ......... 165/80.3, 907 X, 104.26 X, 165/104.33; 174/15.2, 16.3; 357/82; 361/382, 385–388, 395, 399, 400, 401

[56] References Cited

U.S. PATENT DOCUMENTS

| | | | |
|---|---|---|---|
| 3,739,232 | 6/1973 | Grossman | 361/401 |
| 3,741,292 | 6/1973 | Aakalu | 361/385 |
| 3,999,105 | 12/1976 | Archey | 361/385 |
| 4,233,645 | 11/1980 | Balderes | 361/385 |
| 4,245,273 | 1/1981 | Feinberg | 361/382 |
| 4,366,526 | 12/1982 | Lijoi | 361/385 |
| 4,381,032 | 4/1983 | Cutchaw | 165/185 |
| 4,468,717 | 8/1984 | Mathias | 361/382 |
| 4,561,040 | 12/1985 | Eastman | 361/385 |
| 4,590,538 | 5/1986 | Cray, Jr. | 361/385 |
| 4,744,008 | 5/1988 | Black | 361/401 |

Primary Examiner—Gerald P. Tolin
Attorney, Agent, or Firm—David S. Kalmbaugh; J. M. St-Amand

[57] ABSTRACT

High power dissipating micro electronic circuit chips are cooled in a high density package by mounting individual chips on sintered stainless steel pads and surrounding the micro chips with a liquid fluoro-chemical to achieve cooling. The chips are directly bonded to the sintered stainless steel pads and are not packaged in chip carriers. The stainless steel pads provide a solid mounting for the chips to allow for wire bonding of the chips directly to the printed circuit board and electrical interconnections accommodate the differential coefficient of expansion between the chips and the housing. The stainless steel pads acts as wicks drawing the coolant fluid to the bottom side of the chips while the top side of the chips, also in direct contact with the coolant, enable the fluid to boil and remove heat during liquid to vapor transformation, thereby limiting the surface temperature of the chips to the boiling point of the coolant.

16 Claims, 1 Drawing Sheet

LIQUID COOLED HIGH DENSITY PACKAGING FOR HIGH SPEED CIRCUITS

FIELD OF INVENTION

The present invention relates to cooling systems for micro electronic assemblies and particularly liquid cooling of high density integrated circuit chip packages.

BACKGROUND OF THE INVENTION

Packaging requirements for high speed integrated circuits having high pin-out counts and power have created significant problems in printed circuit board technology to accommodate the inter-wiring necessary to create functional boards. This is a direct result of the fact that package size and associated pin-out requirements occupy significant printed circuit board area. Increases in board size and interconnecting lead capacitances result in limiting the operational speed of a system and increase the weight resulting from the added number of printed circuit boards required. In addition, chip power dissipation requires a heatsink to minimize junction temperatures and system thermal gradients.

The temperature of high speed integrated circuit chips must be kept below specified limits to ensure proper function, reliability and useful life. The trend in integrated circuit technology is to pack more circuits per chip, which increases the heat generated per chip. Also, chips are mounted closer together. Such designs cause increases in heat generation requiring new cooling techniques.

In conduction cooling of heat producing elements, a conductive heat transfer medium is placed into contact with a heat producing element. The medium usually has contact with another element which has a greater surface relative to the heat producing element so that heat is more easily dissipated from the greater surface area.

To enhance heat dissipation from surface areas, a fluid may be used as a heat transfer medium to carry away heat by convection. Heat transfer, obviously, is enhanced when there is greater surface contact between the heat producing element and a heat transfer medium. A major problem with known prior art liquid cooling systems is the need for external plumbing, for special fluid pumping systems, and difficulties involved in repairing damaged boards because of such fluid connections.

It is apparent that it would be advantageous to provide an alternative directed to overcoming limitations of the prior art devices set forth above. Accordingly, a suitable alternative is provided including features more fully disclosed hereinafter.

SUMMARY OF THE INVENTION

High power dissipating micro electronic circuit chips are cooled in a high density package. This is accomplished by mounting each of the chips on a sintered stainless steel pad and surrounding the micro chips with a liquid fluoro-chemical to achieve cooling. The chips are not packaged in chip carriers, but are bonded directly to the sintered stainless steel pad using conventional technology. The purpose of the sintered stainless steel pad is to provide a solid mounting for each chip so that they can be wire bonded to the printed circuit board and to accommodate the differential coefficient of expansion between the chips and housing. Within the package, the entire assembly is submerged in flurochemical fluid, such as a flourinated hydrocarbon of suitable dielectric value. The fluid completely surrounds each of the chips, and the sintered stainless steel pads act as wicks drawing the cooling fluid to the bottom side of the chips.

With this arrangement, the top surface of each chip is also in direct contact with the fluid. This enables the fluid to boil, thus removing enormous amounts of heat resulting from the liquid to vapor transformation. Also, the fluid as it boils acts to limit the surface temperature of the chips to the boiling point of the fluid.

Since the chips are wired directly to the printed circuit board, the need for a chip carrier is eliminated and reduces the area of printed circuit board needed by each chip. The interconnections between a chip and printed circuit board are looped to provide for differential movement between the chip and housing and the printed circuit board.

By eliminating the need for chip carriers the entire second level of interconnections is eliminated. The printed circuit board is then packaged as a unit within a housing having covers sealed with O-ring seals enabling the covers to be removed for chip replacement. The housing can be mounted to a compact air-finned heat exchanger, or to a cold plate. A bellows is used to accommodate the volumetric expansion factor of the fluid coolant.

The fluid cooled high density packaging provides advantages not achievable by other methods. Cost is lower because no chip carriers are needed, and high chip density is achieved because no chip package is used. Lower output capacitance results without the use of a ceramic package, and higher chip density is achieved due to fluid cooling. Since the chips are directly wired to the printed circuit board, high pin-outs can be accommodated. The unit size is small because of shorter interconnections between chips and more chips can be accommodated per board. Lead fan-out is accomplished on the printed circuit board and not in a chip carrier. A second level of interconnection is completely eliminated, thus lowering unit costs, and chips can also be replaced. Higher reliability is provided because hot spots on chips and printed circuit board are eliminated. In addition, greater design flexibility is provided allowing chip location to enhance wire routing.

Other objects, advantages and novel features of the invention will become apparent from the following detailed description of the invention when considered in conjunction with the accompaning drawings wherein like numerals refer to like parts in each of the figures.

DESCRIPTION OF THE PREFERRED EMBODIMENTS

Figure 1:
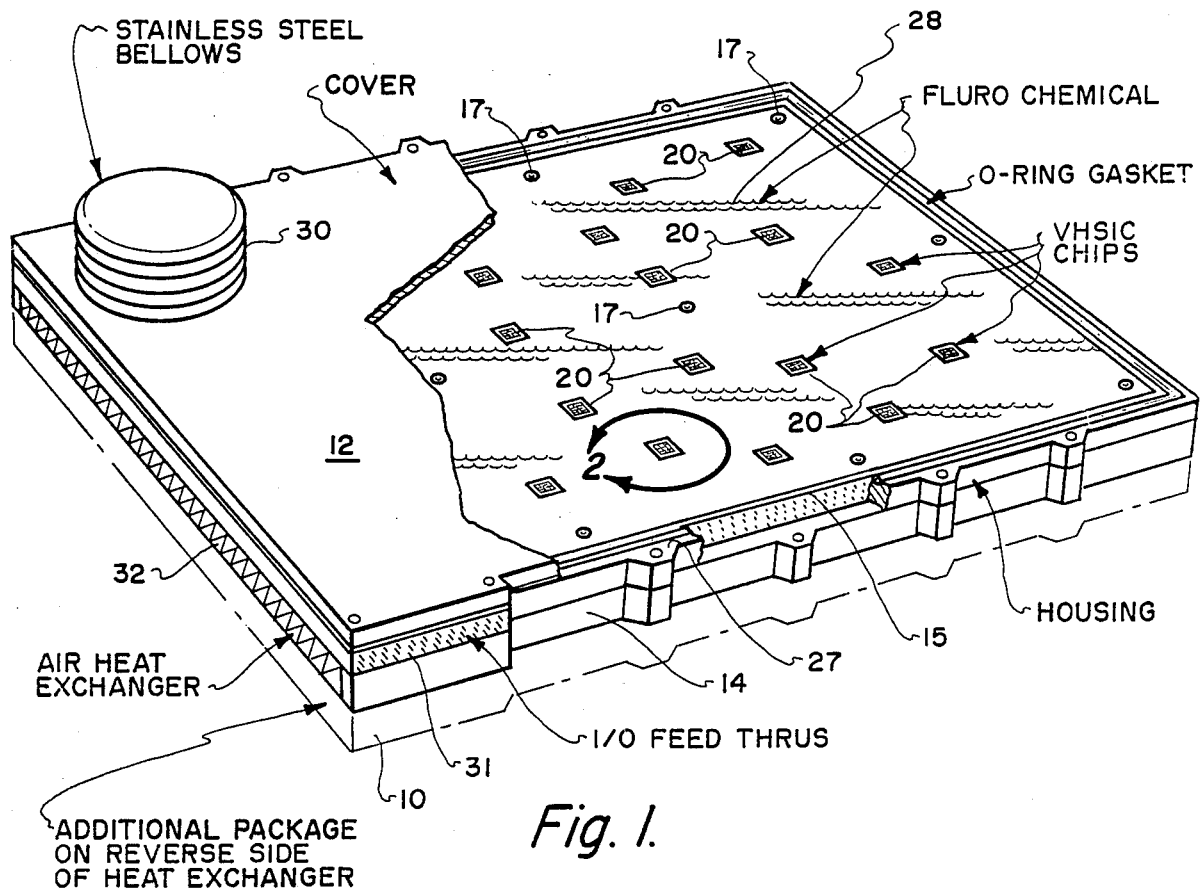
FIG. 1 is an isometric, partially cut-away view of a preferred embodiment of the invention showing high density liquid cooled packaging of high speed integrated circuit chips.
Figure 2:
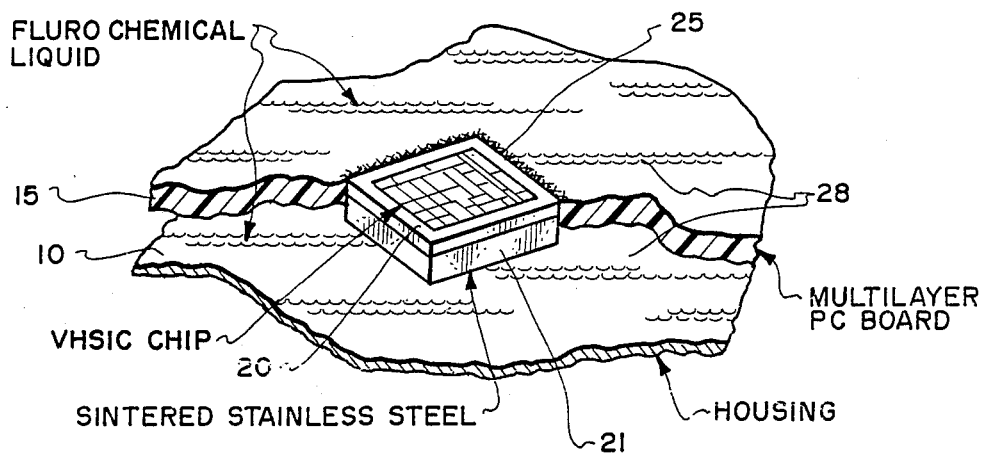
FIG. 2 is an enlarge view of a portion of FIG. 1, showing a single chip mounted on a sintered stainless steel pad in a printed circuit board.

The liquid cooled high density packaging for high speed electronic circuit chips shown in FIGS. 1 and 2 comprises a housing 10, cover 12 and exterior heat exchanger 14. A multilayer printed circuit board 15 is fastened within housing 10 by means of screws 17 or other suitable means. High speed integrated circuit chips 20 are mounted on or bonded to sintered stainless steel pads 21, by suitable conventional means. Pads 21 provide a solid mounting for the chips 20 so they can be wire bonded to and accommodate the differential coefficient of expansion between a chip 20 and the housing 10. The chips, in turn, are connected via pin-outs 25, for example, to circuitry on circuit board 15. As shown, the chips with sintered stainless steel pads are mounted within apertures in the circuit board 15, but may be mounted in other suitable fashion. Housing cover 12 is sealed to housing 10 with an O-ring gasket 27, for example.

The interior of housing 10 is filled with a fluro-chemical fluid coolant 28, of suitable dielectric value, which completely surrounds each chip, and then sealed with the cover 12 and O-ring gasket 27, for example. Each sintered stainless steel pad 21 now acts as a wick which draws the cooling fluid to the bottom side of a respective chip 20. The top surface of each chip is also in direct contact with cooling fluid 28. As a chip generates heat, the fluid can boil, thus removing large amounts of heat due to the liquid to vapor transformation. The boiling fluid will act to limit the chip surface temperature to the boiling point of the fluid. A bellows 30 or other suitable expansion chamber is provided to accommodate any volumetric expansion of the cooling fluid. The bellows 30 may be mounted at any convenient location to suit the situation.

As illustrated in FIGS. 1 and 2, each chip 20 is directly wired to the printed circuit board 15, thus eliminating the need for chip carriers and reducing the area of printed circuit board needed. The interconnections at chip pin-outs are looped, and are slightly greater but not longer than previously used, to provide for differential movement between a chip 20 and the printed circuit board 15, as well as between a chip and housing 10. Feed through pins 31 are for electrically connecting circuit board 15 to external circuitry.

Housing 10 is mounted to an air finned compact heat exchanger 32, but other suitable heat exchanger means may be used. A cold plate can be used in place of the air finned heat exchanger in space applications, for example. For space applications, the housing unit can be hermetically sealed, using a solder band that can be peeled off (i.e., similar to that used with coffee cans) to access the internal components. An additional electronic package 10, or other type of package, can be mounted on the opposite side of heat exchanger 32, as shown in FIG. 1, if desired.

Obviously many modifications and variations of the present invention are possible in the light of the above teachings. It is therefore to be understood that within the scope of the appended claims, the invention may be practiced otherwise than as specifically described.

What is claimed is:

1. A liquid cooled high density packaging system for high speed integrated circuit chips, comprising:
   a. a housing means having removable and hermetically sealed closure means, and which contains printed circuit substrate means;
   b. a plurality of integrated circuit chip means each having a bottom surface being directly bonded to a respective sintered stainless steel pad at a top surface thereof;
   c. said plurality of integrated circuit chip means with sintered stainless steel pads in turn being mounted onto said printed circuit substrate means and directly electrically interconnected into circuitry of said printed circuit substrate means to form an electronic assembly;
   d. said integrated circuit chip means with sintered stainless steel pads being mounted to said printed circuit substrate means in a manner which allows for movement due to differential in coefficient of expansion between said integrated circuit chip means, said housing means, and said printed circuit substrate means;
   e. said housing being filled with a dielectric fluid coolant which submerges said electronic assembly and thereby completely surrounds the said integrated circuit chip means and sintered stainless steel pads with said fluid coolant;
   f. said sintered stainless pads providing solid mounts for said integrated circuit chip means and also acting as wicks to draw said fluid coolant to one surface of said integrated circuit chip means while the opposite surface thereof is in direct contact with said fluid coolant, thus enabling said fluid coolant to boil due to heat generated by the said integrated chip means and remove great amounts of said generated heat as a result of liquid to vapor transformation of the fluid coolant and thereby limit the temperature of said integrated circuit chip means to the boiling point of said fluid coolant, whereby higher integrated circuit chip means density on the printed circuit substrate means is achievable due to lower output capacitance and the permissible use of shorter interconnections between chips as well as elimination of chip carriers.

2. A packaging system for integrated circuit chips as in claim 1, wherein an expansion means is provided to accommodate any volumetric expansion of said fluid coolant.

3. A packaging system for integrated circuit chips as in claim 2, wherein said expansion means is a bellows chamber.

4. A packaging system for integrated circuit chips as in claim 1, wherein an O-ring gasket means is provided for sealing said closure means to said housing means.

5. A packaging system for integrated circuit chips as in claim 1, wherein said fluid coolant is a fluoro-chemical dielectric.

6. A packaging system for integrated circuit chips as in claim 1, wherein said housing means is mounted against one side of a compact heat exchanger means.

7. A packaging system for integrated circuit chips as in claim 6, wherein said compact heat exchanger means is a substantially flat air finned heat exchanger of similar shape and dimmensions as said housing means.

8. A packaging system for integrated circuit chips as in claim 6, wherein a second housing means containing a said electronic assembly and fluid coolant is mounted on an opposite side of said compact heat exchanger means.

9. A packaging system for integrated circuit chips as in claim 1, wherein said integrated circuit chip means with sintered stainless steel pads are each mounted within respective apertures in said printed circuit substrate means.

10. A liquid cooled high density packaging system for high speed integrated circuit chips, comprising:
   a. a hermetically sealed housing module having printed circuit substrate means therein;
   b. a plurality of heat generating integrated circuit chip means each having a bottom surface being bonded directly to a respective sintered stainless steel pad at a top surface thereof;

c. said integrated circuit chip means with sintered stainless steel pads being electrically interconnected into circuitry of said printed circuit substrate means to form an electronic assembly within said housing module;

d. said housing module being filled with a low boiling point dielectric liquid coolant which submerges said electronic assembly and thereby surrounds the said heat generating integrated circuit chip means and sintered stainless steel pads with said liquid coolant;

e. said sintered stainless pads acting as wicks to draw said liquid coolant to one surface of respective said integrated circuit chip means while the opposite surface thereof is in direct contact with said liquid coolant, thus enabling said liquid coolant to boil due to heat generated by the said integrated chip means and thereby remove generated heat from the integrated circuit chips as a result of liquid to vapor transformation of the fluid coolant and limit the temperature of the integrated circuit chip means to the boiling point of said liquid coolant, whereby higher integrated circuit chip means density on the printed circuit substrate means is achievable due to lower output capacitance and the permissible use of shorter interconnections between chips as well as elimination of chip carriers.

11. A cooling packaging system for integrated circuit chips as in claim 10, wherein expansion means is provided to accommodate any volumetric expansion of said liquid coolant.

12. A cooling packaging system for integrated circuit chips as in claim 10, wherein said integrated circuit chip means with sintered stainless steel pads are mounted to said printed circuit substrate means by electrical means which allows for movement due to the differential in coefficient of expansion between said integrated circuit chip means, said housing module, and said printed circuit substrate means.

13. A cooling packaging system for integrated circuit chips as in claim 10, wherein said integrated circuit chip means with sintered stainless steel pads are each mounted within respective apertures in said printed circuit substrate means.

14. A cooling packaging system for integrated circuit chips as in claim 10 wherein said liquid coolant is a fluoro-chemical dielectric.

15. A cooling packaging system for integrated circuit chips as in claim 10, wherein said housing means is mounted against one side of a compact heat exchanger means.

16. A cooling packaging system for integrated circuit chips as in claim 15, wherein a second housing means containing a said electronic assembly and liquid coolant is mounted on an opposite side of said compact heat exchanger means.

* * * * *